US007223519B2

(12) United States Patent
Barr et al.

(10) Patent No.: US 7,223,519 B2
(45) Date of Patent: *May 29, 2007

(54) IMAGING COMPOSITIONS AND METHODS

(75) Inventors: Robert K. Barr, Shrewsbury, MA (US); Corey O'Connor, Worcester, MA (US)

(73) Assignee: Rohm and Haas Electronic Materials LLC, Marlborough, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/180,950

(22) Filed: Jul. 13, 2005

(65) Prior Publication Data

US 2005/0266345 A1 Dec. 1, 2005

Related U.S. Application Data

(63) Continuation of application No. 10/890,507, filed on Jul. 12, 2004, now Pat. No. 7,144,676, which is a continuation-in-part of application No. 10/773,990, filed on Feb. 6, 2004, which is a continuation-in-part of application No. 10/773,991, filed on Feb. 6, 2004, which is a continuation-in-part of application No. 10/773,989, filed on Feb. 6, 2004.

(51) Int. Cl.

| | |
|---|---|
| ***G03C 1/73*** | (2006.01) |
| ***G03F 7/031*** | (2006.01) |
| ***G03F 7/032*** | (2006.01) |
| ***G03F 7/20*** | (2006.01) |
| ***G03F 7/42*** | (2006.01) |

(52) U.S. Cl. .................. 430/270.1; 430/926; 430/138; 430/256; 430/258; 430/259; 430/262; 430/263; 430/329; 430/332; 430/336; 430/337; 430/340; 430/343; 430/346; 430/356; 430/358; 430/359; 430/363; 430/367; 430/372; 430/428; 430/541; 430/339; 430/374; 430/962; 430/338; 522/63; 522/65; 522/68

(58) Field of Classification Search .................... None
See application file for complete search history.

(56) References Cited

U.S. PATENT DOCUMENTS

| | | | | |
|---|---|---|---|---|
| 3,390,994 | A | 7/1968 | Cescon | 526/95 |
| 3,390,997 | A | 7/1968 | Read | 430/332 |
| 3,445,234 | A | 5/1969 | Cescon et al. | 430/332 |
| 3,598,592 | A | 8/1971 | Cescon | 430/340 |
| 3,630,736 | A | 12/1971 | Cescon et al. | 430/343 |
| 3,652,275 | A | 3/1972 | Baum et al. | 430/269 |
| 3,658,543 | A | 4/1972 | Gerlach, Jr. et al. | 430/343 |
| 3,666,466 | A | 5/1972 | Strilko | 430/333 |
| 3,726,804 | A | 4/1973 | Matsukawa et al. | 264/4.7 |
| 3,796,696 | A | 3/1974 | Brown | 526/84 |
| 3,968,123 | A | 7/1976 | Dingwall et al. | 549/7 |
| 3,977,953 | A | 8/1976 | Von Hirsch et al. | 204/157.9 |
| 3,993,489 | A | 11/1976 | Heimsch et al. | 430/14 |
| 4,017,313 | A | 4/1977 | Hartzler | 430/346 |
| 4,065,315 | A | 12/1977 | Yamazaki et al. | 430/269 |
| 4,090,877 | A | 5/1978 | Streeper | 430/337 |
| 4,147,552 | A | 4/1979 | Specht et al. | 430/195 |
| 4,155,892 | A | 5/1979 | Emmons et al. | 524/507 |
| 4,162,162 | A | 7/1979 | Dueber | 430/288.1 |
| 4,212,937 | A | 7/1980 | Akashi et al. | 430/620 |
| 4,280,888 | A | 7/1981 | Bush et al. | 522/81 |
| 4,311,783 | A | 1/1982 | Dessauer | 430/270.1 |
| 4,320,140 | A | 3/1982 | Crounse et al. | 514/454 |
| 4,341,860 | A | 7/1982 | Sysak | 430/277.1 |
| 4,343,885 | A | 8/1982 | Reardon, Jr. | 430/270.1 |
| 4,535,052 | A | 8/1985 | Anderson et al. | 430/277.1 |
| 4,565,769 | A | 1/1986 | Dueber et al. | 430/281.1 |
| 4,575,625 | A | 3/1986 | Knowles | 235/462.3 |
| 4,619,956 | A | 10/1986 | Susi | 524/87 |
| 4,647,578 | A | 3/1987 | Crounse et al. | 514/454 |
| 4,874,799 | A | 10/1989 | Hung et al. | 522/96 |
| 4,882,265 | A | 11/1989 | Laganis et al. | 430/522 |
| 4,894,314 | A | 1/1990 | Barr et al. | 430/281.1 |
| 4,917,977 | A | 4/1990 | Smothers | 430/1 |
| 4,962,009 | A | 10/1990 | Washizu et al. | 430/138 |
| 4,987,230 | A | 1/1991 | Monroe | 546/94 |
| 5,008,231 | A | 4/1991 | Yoshizawa et al. | 503/207 |
| 5,019,549 | A | 5/1991 | Kellogg et al. | 503/227 |
| 5,102,952 | A | 4/1992 | Memon | 525/67 |
| 5,112,721 | A | 5/1992 | Kuchta | 430/281.1 |
| 5,137,571 | A | 8/1992 | Eisenhart et al. | 106/162.8 |
| 5,147,758 | A | 9/1992 | Smothers et al. | 430/281.1 |
| 5,204,206 | A * | 4/1993 | Iwase et al. | 430/253 |

(Continued)

FOREIGN PATENT DOCUMENTS

| | | |
|---|---|---|
| JP | 11-109555 | 4/1999 |

OTHER PUBLICATIONS

Grant & Hackh's Chemical Dictionary; Fifth Edition; pp. 306 and 469.

(Continued)

*Primary Examiner*—Sin Lee
(74) *Attorney, Agent, or Firm*—John J. Piskorski

(57) ABSTRACT

Imaging compositions and methods of using the compositions are disclosed. The imaging compositions are sensitive to low levels of energy such that upon application of the low levels of energy the compositions change color or shade. The compositions may be applied to a work piece to mark it and removed from the work piece by peeling.

9 Claims, No Drawings

U.S. PATENT DOCUMENTS

| | | | | |
|---|---|---|---|---|
| 5,204,467 A | | 4/1993 | Smothers | 546/94 |
| 5,219,917 A | | 6/1993 | Ingle et al. | 524/516 |
| 5,225,312 A | | 7/1993 | Dixit et al. | 430/191 |
| 5,236,808 A | | 8/1993 | Smothers | 430/281.1 |
| 5,244,769 A | | 9/1993 | Yanagihara et al. | 430/18 |
| 5,256,520 A | | 10/1993 | Smothers | 430/281.1 |
| 5,302,429 A | | 4/1994 | Memon | 428/35.7 |
| 5,320,933 A | | 6/1994 | Lundy et al. | 430/283.1 |
| 5,332,819 A | | 7/1994 | Smothers | 546/94 |
| 5,369,140 A | | 11/1994 | Valet et al. | 522/75 |
| 5,389,489 A | | 2/1995 | Yanagihara et al. | 430/138 |
| 5,395,718 A | | 3/1995 | Jensen et al. | 430/5 |
| 5,397,686 A | * | 3/1995 | Dominick et al. | 430/346 |
| 5,401,608 A | | 3/1995 | Pawlowski et al. | 430/270.1 |
| 5,413,629 A | | 5/1995 | Yasui et al. | 106/31.15 |
| 5,414,041 A | | 5/1995 | Larson et al. | 524/589 |
| 5,444,505 A | | 8/1995 | Dorsey-Palmateer | 353/28 |
| 5,484,927 A | | 1/1996 | Smothers | 546/126 |
| 5,552,249 A | | 9/1996 | Jensen et al. | 430/5 |
| 5,651,600 A | | 7/1997 | Dorsey-Palmateer | 353/122 |
| 5,665,522 A | | 9/1997 | Vogel et al. | 430/278.1 |
| 5,705,298 A | | 1/1998 | Knoedl, Jr. | 430/2 |
| 5,705,560 A | | 1/1998 | Takarabe et al. | 524/556 |
| 5,723,653 A | | 3/1998 | Santhanam | 560/196 |
| 5,742,385 A | | 4/1998 | Champa | 356/141.4 |
| 5,744,280 A | | 4/1998 | Mooney, III et al. | 430/270.1 |
| 5,786,132 A | | 7/1998 | Nohr et al. | 430/343 |
| 5,821,497 A | | 10/1998 | Yamazaki et al. | 219/121.69 |
| 5,831,661 A | | 11/1998 | Tabuchi et al. | 347/262 |
| 5,837,429 A | | 11/1998 | Nohr et al. | 430/343 |
| 5,846,682 A | | 12/1998 | Murofushi et al. | 430/108.2 |
| 5,858,583 A | | 1/1999 | Dessauer et al. | 430/17 |
| 5,942,554 A | | 8/1999 | Ren et al. | 522/25 |
| 5,955,224 A | | 9/1999 | Caspar et al. | 430/17 |
| 6,096,479 A | * | 8/2000 | Kawamura et al. | 430/270.1 |
| 6,120,946 A | | 9/2000 | Johnson et al. | 430/7 |
| 6,124,044 A | | 9/2000 | Swidler | 428/500 |
| 6,187,432 B1 | | 2/2001 | Krish et al. | 428/343 |
| 6,242,149 B1 | | 6/2001 | Maeda | 430/138 |
| 6,251,571 B1 | | 6/2001 | Dessauer et al. | 430/343 |
| 6,309,797 B1 | | 10/2001 | Grinevich et al. | 430/293 |
| 6,322,950 B1 | | 11/2001 | Sorori et al. | 430/281.1 |
| 6,331,286 B1 | | 12/2001 | Dees et al. | 424/1.85 |
| 6,387,584 B1 | * | 5/2002 | Ikeda et al. | 430/138 |
| 6,411,362 B2 | | 6/2002 | Anderson et al. | 355/50 |
| 6,433,035 B1 | | 8/2002 | Grinevich et al. | 522/2 |
| 6,433,069 B1 | | 8/2002 | Oeltjen et al. | 524/505 |
| 6,482,879 B2 | | 11/2002 | Hieltjes et al. | 524/398 |
| 6,492,019 B1 | | 12/2002 | Shipston et al. | 428/355 EN |
| 6,503,621 B1 | | 1/2003 | Ma et al. | 428/355 BL |
| 6,527,900 B1 | | 3/2003 | Kreckel et al. | 156/247 |
| 6,528,555 B1 | | 3/2003 | Nikutowski et al. | 523/116 |
| 6,541,109 B1 | | 4/2003 | Kumar et al. | 428/352 |
| 6,545,084 B2 | | 4/2003 | Brown et al. | 524/556 |
| 6,547,397 B1 | | 4/2003 | Kaufman et al. | 353/28 |
| 6,555,615 B2 | | 4/2003 | Van Rheenen | 524/606 |
| 6,576,391 B1 | * | 6/2003 | Iguchi et al. | 430/270.1 |
| 6,613,381 B1 | | 9/2003 | Bredahl et al. | 427/207.1 |
| 6,627,309 B2 | | 9/2003 | Stebbings et al. | 428/352 |
| 6,632,522 B1 | | 10/2003 | Hyde et al. | 428/355 R |
| 6,653,265 B2 | | 11/2003 | Rossi et al. | 510/206 |
| 6,660,374 B2 | | 12/2003 | Smetana et al. | 428/327 |
| 6,754,551 B1 | | 6/2004 | Zohar et al. | 700/121 |
| 6,828,525 B1 | | 12/2004 | Hayes et al. | 219/121.85 |
| 2003/0108708 A1 | | 6/2003 | Anderson et al. | 428/64.4 |
| 2003/0149164 A1 | | 8/2003 | Minnee et al. | 524/556 |
| 2005/0058332 A1 | | 3/2005 | Kaufman et al. | 382/133 |

OTHER PUBLICATIONS

Enthone Imaging Technologies Update; Photoimageable Legend Inks: Selection Criteria; Jun. 2002/No. 12.

Basic Printed Circuit Board Manufacture; Electronics Industry Training/Workshop 23; May 2002; pp. 1-13.

Technical Data Sheet Scribe ELP112; Aqueous Developable Liquid Photoimageable Legend Paste; Web site: www.electrapolymers.com, pp. 1-5, date not available.

MEGA Electronics; Screen Printing Instructions; Mega Electronics Ltd, Englnad; Web site: http://www.megaelect.demon.co.uk/; pp. 1-6, date not available.

* cited by examiner

IMAGING COMPOSITIONS AND METHODS

The Patent Application is a continuation-in-part of co-pending patent applications Ser. Nos. 10/773,989, 10/773,990, and 10/773,991 filed Feb. 6, 2004.

BACKGROUND OF THE INVENTION

The present invention is directed to imaging compositions and methods where the imaging compositions undergo a color or shade change upon exposure to energy at low intensities. More specifically, the present invention is directed to imaging compositions and methods where the imaging compositions undergo a color or shade change upon exposure to energy at low intensities and may be peeled from workpieces on which they are coated.

There are numerous compositions and methods employed in various industries to form images on substrates to mark the substrates. Such industries include the paper industry, packaging industry, paint industry, medical industry, dental industry, electronics industry, textile industry, aeronautical, marine and automotive industries, and the visual arts, to name a few. Imaging or marking typically is used to identify an article such as the name or logo of a manufacturer, a serial number or lot number, tissue types, or may be used for alignment purposes in the manufacture of semiconductor wafers, aeronautical ships, marine vessels and terrestrial vehicles.

Marking also is employed in proofing products, photoresists, soldermasks, printing plates and other photopolymer products. For example, U.S. Pat. No. 5,744,280 discloses photoimageable compositions allegedly capable of forming monochrome and multichrome images, which have contrast image properties. The photoimageable compositions include photooxidants, photosensitizers, photodeactivation compounds and deuterated leuco compounds. The leuco compounds are aminotriarylmethine compounds or related compounds in which the methane (central) carbon atom is deuterated to the extant of at least 60% with deuterium incorporation in place of the corresponding hydrido aminotriaryl-methine. The patent alleges that the deuterated leuco compounds provide for an increased contrast imaging as opposed to corresponding hydrido leuco compounds. Upon exposure of the photoimageable compositions to actinic radiation a phototropic response is elicited.

Marking of information on labels, placing logos on textiles, or stamping information such as company name, a part or serial number or other information such as a lot number or die location on semiconductor devices may be affected by direct printing. The printing may be carried out by pad printing or screen printing. Pad printing has an advantage in printing on a curved surface because of the elasticity of the pad but is disadvantageous in making a fine pattern with precision. Screen printing also meets with difficulty in obtaining a fine pattern with precision due to the limited mesh size of the screen. Besides the poor precision, since printing involves making a plate for every desired pattern or requires time for setting printing conditions, these methods are by no means suitable for uses demanding real time processing.

Hence, marking by printing has recently been replaced by ink jet marking. Although ink jet marking satisfies the demand for speed and real time processing, which are not possessed by many conventional printing systems, the ink to be used, which is jetted from nozzles under pressure, is strictly specified. Unless the specification is strictly met, the ink sometimes causes obstruction of nozzles, resulting in an increase of reject rate.

In order to overcome the problem, laser marking has lately been attracting attention as a high-speed and efficient marking method and is already put to practical use in some industries. Many laser marking techniques involve irradiating only necessary areas of substrates with laser light to denature or remove the irradiated area or irradiating a coated substrate with laser light to remove the irradiated coating layer thereby making a contrast between the irradiated area (marked area) and the non-irradiated area (background).

Using a laser to mark an article such as a semiconductor chip is a fast and economical means of marking. There are, however, certain disadvantages associated with state-of-the art laser marking techniques that burn the surface to achieve a desired mark. For example, a mark burned in a surface by a laser may only be visible at select angles of incidence to a light source. Further, oils or other contaminants deposited on the article surface subsequent to marking may blur or even obscure the laser mark. Additionally, because the laser actually burns the surface of the work piece, for bare die marking, the associated burning may damage any underlying structures or internal circuitry or by increasing internal die temperature beyond acceptable limits. Moreover, where the manufactured part is not produced of a laser reactive material, a laser reactive coating applied to the surface of a component adds expense and may take hours to cure.

Alternatively, laser projectors may be used to project images onto surfaces. They are used to assist in the positioning of work pieces on work surfaces. Some systems have been designed to project three-dimensional images onto contoured surfaces rather than flat surfaces. The projected images are used as patterns for manufacturing products and to scan an image of the desired location of a ply on previously placed plies. Examples of such uses are in the manufacturing of leather products, roof trusses, and airplane fuselages. Laser projectors are also used for locating templates or paint masks during the painting of aircraft.

The use of scanned laser images to provide an indication of where to place or align work piece parts, for drilling holes, for forming an outline for painting a logo or picture, or aligning segments of a marine vessel for gluing requires extreme accuracy in calibrating the position of the laser projector relative to the work surface. Typically six reference points are required for sufficient accuracy to align work piece parts. Reflectors or sensors are positioned in an approximate area where the ply is to be placed. Since the points are at fixed locations relative to the work and the laser, the laser also knows where it is relative to the work. Typically, workers hand mark the place where the laser beam image contacts the work piece with a marker or masking tape to define the laser image. Such methods are tedious, and the workers' hands may block the laser image disrupting the alignment beam to the work piece. Accordingly, misalignment may occur.

Another problem associated with laser marking is the potential for ophthalmological damage to the workers. Many lasers used in marking may cause retinal damage to workers. Generally, lasers, which generate energy exceeding 5 mW present hazards to workers.

Accordingly, there is a need for improved imaging compositions and methods of marking a work piece.

SUMMARY OF THE INVENTION

Imaging compositions include one or more sensitizers in sufficient amounts to affect a color or shade change in the compositions upon application of energy at powers of 5 mW or less, the imaging compositions may be peeled from the work piece on which they are coated.

In another embodiment the imaging compositions include one or more sensitizers in sufficient amounts to affect a color or shade change in the compositions upon application of energy at powers of 5 mW or less, one or more polymers having a Tg of from −60° C. to greater than 80° C. and one or more amphoteric surfactants having an isoelectric point at pH 3 to pH 8.

The imaging compositions also may include one or more plasticizers, flow agents, chain transfer agents, organic acids, accelerators, non-ionic surfactants, thickeners, monomers, rheology modifiers, diluents and other optional components to tailor the compositions for a particular marking method and work piece. The compositions may then be applied to a work piece to form an image, which may be used to manufacture a product.

Methods of imaging include providing an imaging composition comprising one or more sensitizers in sufficient amounts to affect a color or shade change upon exposure of energy at powers of 5 mW or less, applying the imaging composition to a work piece; applying energy at powers of 5 mW or less to the imaging composition to affect the color or shade change; executing a task on the work piece as directed by the color or shade change of the composition to modify the work piece; and peeling the composition from the work piece. The energy may be applied selectively to form an imaged pattern on the work piece. Prior to executing the task on the work piece, and after exposure of the imaging composition to the energy, workers may selectively peel portions of the composition from the work piece then execute the task to modify the work piece.

In yet a further embodiment a method comprises providing an imaging composition comprising one or more sensitizers in sufficient amounts to affect a color or shade change in the composition upon exposure to energy at powers of 5 mW or less, one or more micro-encapsulated antioxidants and one or more color formers; applying the imaging composition to a work piece; applying energy to the imaging composition at the intensities of 5 mW or less to affect the color or shade change; stabilizing the color or shade change; executing a task on the work piece as directed by the color or shade change to modify the work piece; and peeling the composition from the work piece.

The color or shade change may be used in the manufacture or repair of work pieces to alter the initial color or shade of a work piece, or to vary the color or shade of a work piece upon exposure to suitable energy levels. The imaging compositions and methods provide a rapid and efficient means of changing the color or shade of a work piece or of placing an image on a work piece such as aeronautical ships, marine vessels and terrestrial vehicles, or for forming images on textiles.

The image may be used as a mark or indicator, for example, to drill holes for fasteners to join parts together, to form an outline for making a logo or picture on an airplane, or to align segments of marine vessel parts. Since the compositions may be promptly applied to the work piece and the image promptly formed by application of energy at powers of 5 mW or less to create a color or shade contrast, workers no longer need to be adjacent the work piece to mark laser beam images with a hand-held marker or tape in the fabrication of articles. Accordingly, the problems of blocking light caused by the movement of workers hands and the slower and tedious process of applying marks by workers using a hand-held marker or tape is eliminated. Further, the low intensities of energy, which are used to cause the color or shade change, eliminates or at least reduces the potential for ophthalmological damage to workers.

The reduction of human error increases the accuracy of marking. This is important when the marks are used to direct the alignment of parts such as in aeronautical ships, marine vessels or terrestrial vehicles where accuracy in fabrication is critical to the reliable and safe operation of the machine.

The imaging compositions may be applied to the substrate by methods such as spray coating, brushing, roller coating, ink jetting, dipping or other suitable methods. Energy sources for applying a sufficient amount of energy to create the color or shade change include, but are not limited to, laser, infrared and ultraviolet light generating apparatus. Conventional apparatus may be employed, thus new and specialized apparatus are not necessary to use the compositions and methods. Additionally, the single, non-selective coating application of the compositions on the work piece followed by prompt application of energy to create the color or shade change makes the compositions suitable for assembly line use. Also, the compositions may be peeled from the work piece avoiding the use of undesirable solvents or developers. Such solvents and developers may be carcinogenic and potentially contaminate the environment thus, costly waste treatment is used to reduce environmental pollution. Accordingly, the compositions provide for more efficient manufacturing than many conventional alignment and imaging processes, and also reduce the amount of waste treatment.

DETAILED DESCRIPTION OF THE INVENTION

As used throughout this specification, the following abbreviations have the following meaning, unless the context indicates otherwise: ° C.=degrees Centigrade; IR=infrared; UV=ultraviolet; gm=gram; mg=milligram; L=liter; mL=milliliter; wt %=weight percent; erg=1 dyne cm=$10^{-7}$ joules; J=joule; mJ=millijoule; nm=nanometer=$10^{-9}$ meters; cm=centimeters; mm=millimeters; W=watt=1 joule/second; and mW=milliwatt; ns=nanosecond; μsec=microsecond; Hz=hertz; μm=microns; and $T_g$=glass transition temperature.

The terms "polymer" and "copolymer" are used interchangeably throughout this specification. "Actinic radiation" means radiation from light that produces a chemical change. "Photofugitive response" means that the application of energy causes a colored material to fade or become lighter. "Phototropic response" means that the application of energy causes material to darken. "Changing shade" means that the color fades, or becomes darker. "(Meth)acrylate" includes both methacrylate and acrylate, and "(meth)acrylic acid" includes both methacrylic acid and acrylic acid. "Diluent" means a carrier or vehicle, such as solvents or solid fillers. Room temperature is from 18° C. to 25° C.

Unless otherwise noted, all percentages are by weight and are based on dry weight or solvent free weight. All numerical ranges are inclusive and combinable in any order, except where it is logical that such numerical ranges are constrained to add up to 100%.

Imaging compositions include one or more sensitizers in sufficient amounts to affect a color or shade change upon exposure to energy at powers of 5 mW or less, the imaging composition may be peeled from the work piece on which it is coated. The imaging compositions may be applied to a work piece followed by applying energy at powers of 5 mW or less to affect a color or shade change on the entire work piece, or to form an imaged pattern on the work piece. For example, an imaging composition may be applied selectively to a work piece followed by the application of energy to affect the color or shade change to produce an imaged pattern on the work piece. Alternatively, the imaging composition may cover the entire work piece and the energy applied selectively to affect the color or shade change to form an imaged pattern on the work piece. When the diluent is a liquid, the imaging composition may be imaged before or after drying.

The imaging compositions may be applied to a work piece by any suitable method as discussed below. The compositions may be removed by peeling the unwanted portions from a work piece. They may be hand-peeled from the work piece or peeled by using any suitable apparatus known in the art. Accordingly, environmentally hazardous solvents and developers may be avoided, and less waste is generated by using the peelable compositions.

Sensitizers employed in the compositions are compounds which are activated by energy to change color or shade, or upon activation cause one or more other compounds to change color or shade. The imaging compositions include one or more photosensitizers sensitive to visible light and may be activated with energy at powers of 5 mW or less. Generally, such sensitizers are included in amounts of from 0.005 wt % to 10 wt %, or such as from 0.05 wt % to 5 wt %, or such as from 0.1 wt % to 1 wt % of the imaging compositions.

Sensitizers, which are activated in the visible range, typically are activated at wavelengths of from above 300 nm to less than 600 nm, or such as from 350 nm to 550 nm, or such as from 400 nm to 535 nm. Such sensitizers include, but are not limited to, xanthene compounds and cyclopentanone based conjugated compounds.

Suitable xanthene compounds include, but are not limited to, compounds having the general formula:

(I)

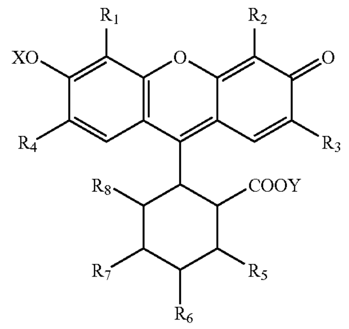

where X is hydrogen, sodium ion, or potassium ion; Y is hydrogen, sodium ion, potassium ion or —$C_2H_5$; $R_1$ is hydrogen, $Cl^-$, $Br^-$, or $I^-$; $R_2$ is hydrogen, $CF^-$, $Br^-$, or $I^-$; $R_3$ is hydrogen, $Cl^-$, $Br^-$, $I^-$, or —$NO_2$; $R_4$ is hydrogen, —$NO_2$, $CF^-$, $Br^-$, or $I^-$; $R_5$ is hydrogen, $Cl^-$or $Br^-$; $R_6$ is hydrogen, $Cl^-$, or $Br^-$; $R_6$ is hydrogen, $Cl^-$, or $Br^-$; $R_7$ is hydrogen, $Cl^-$, or $Br^-$; and $R_8$ is hydrogen, $Cl^-$, or $Br^-$.

Examples of such xanthene compounds are compounds such as fluorescein and derivatives thereof such as the halogenated xanthenes such as 2',4',5',7'-tetrabromo-3,4,5,6-tetrachlorofluorescein (phloxin B), 2',4',5',7'-tetraiodofluorescein (erythrosin, erythrosin B, or C.I. Acid Red 51), 2',4',5',7'-tetraiodo-3,4,5,6-tetrachlorofluorescein (Rose Bengal), 2',4',5',7',3,4,5,6-octabromofluorescein (octabromofluorescein), 4,5,6,7-tetrabromoerythrosin, 4',5'-dichlorofluorescein, 2',7'-dichlorofluorescein, 4,5,6,7-tetrachlorofluorescein, 2',4',5',7'-tetrachlorofluorescein, dibromofluorescein, Solvent Red 72, diiodofluorescein, eosin B, eosin Y, ethyl eosin, and salts thereof. Typically, the salts are alkali metal salts such as the sodium and potassium salts. Such xanthene compounds typically are used in amounts of from 0.05 wt % to 2 wt %, or such as from 0.25 wt % to 1 wt %, or such as from 0.1 wt % to 0.5 wt % of the composition.

Examples of suitable cyclopentanone based conjugated compounds are cyclopentanone, 2,5-bis-[4-(diethylamino) phenyl]methylene]-, cyclopentanone, 2,5-bis[(2,3,6,7-tetrahydro-1H,5H-benzo[i,j]quinolizin-9-yl)methylene]-,and cyclopentanone, 2,5-bis-[4-(diethyl-amino)-2-methylphenyl]methylene]-. Such cyclopentanones may be prepared from cyclic ketones and tricyclic aminoaldehydes by methods known in the art.

Examples of such suitable conjugated cyclopentanones have the following formula:

(II)

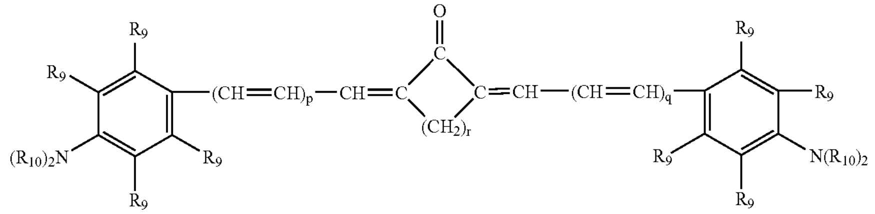

where p and q independently are 0 or 1, r is 2 or 3; and R9 is independently hydrogen, linear or branched (C1–C10) aliphatic, or linear or branched (C1–C10)alkoxy, typically R9 is independently hydrogen, methyl or methoxy; R10 is independently hydrogen, linear or branched (C1–C10)aliphatic, (C5–C7)ring, such as an alicyclic ring, alkaryl, phenyl, linear or branched (C1–C10)hydroxyalkyl, linear or branched hydroxy terminated ether, such as —(CH2)v-O—(CHR20)w-OH, where v is an integer of from 2 to 4, w is an integer of from 1 to 4, and R20 is hydrogen or methyl and carbons of each R10 may be taken together to form a 5 to 7 membered ring with the nitrogen, or a 5 to 7 membered ring with the nitrogen and with another heteroatom chosen from oxygen, sulfur, and a second nitrogen. Such sensitizers may be activated at powers of 5 mW or less.

Other sensitizers which are activated in the visible light range include, but are not limited to, N-alkylamino aryl ketones such as bis(9-julolidyl ketone), bis-(N-ethyl-1,2,3,4-tetrahydro-6-quinolyl)ketone and p-methoxyphenyl-(N-ethyl-1,2,3,4-tetrahydro-6-quinolyl)ketone; visible light absorbing dyes prepared by base catalyzed condensation of an aldehyde or dimethinehemicyanine with the corresponding ketone; visible light absorbing squarylium compounds; 1,3-dihydro-1-oxo-2H-indene derivatives; any of the coumarin based dyes which include, but are not limited to, ketocoumarin, and 3,3'-carbonyl bis(7-diethylaminocoumarin), coumarin 6, coumarin 7, coumarin 99, coumarin 314 and dimethoxy coumarin 99; halogenated titanocene compounds such as bis(eta.5-2,4-cyclopentadien-1-yl)-bis(2,6-difluro-3-(1H-pyrrol-1-yl)-phenyl)titanium; and compounds derived from aryl ketones and p-dialkylaminoarylaldehydes. Methods of making the foregoing sensitizers are known in the art or disclosed in the literature. Also, many are commercially available.

Optionally, the imaging compositions may include one or more photosensitizers that are activated by UV light. Such sensitizers which are activated by UV light are typically activated at wavelengths of from above 10 nm to less than 300 nm, or such as from 50 nm to 250 nm, or such as from 100 nm to 200 nm. Such UV activated sensitizers include, but are not limited to, polymeric sensitizers having a weight average molecular weight of from 10,000 to 300,000 such as polymers of 1-[4-(dimethylamino)phenyl]-1-(4-methoxyphenyl)-methanone, 1-[4-(dimethylamino)phenyl]-1-(4-hydroxyphenyl)-methanone and 1-[4-(dimethylamino)phenyl]-1-[4-(2-hydroxyethoxy)-phenyl]-methanone; free bases of ketone imine dyestuffs; amino derivatives of triarylmethane dyestuffs; amino derivatives of xanthene dyestuffs; amino derivatives of acridine dyestuffs; methine dyestuffs; and polymethine dyestuffs. Methods of preparing such compounds are known in the art. Typically, such UV activated sensitizers are used in amounts of from 0.05 wt % to 1 wt %, or such as from 0.1 wt % to 0.5 wt % of the composition.

Optionally, the imaging compositions may include one or more photosensitizers that are activated by IR light. Such sensitizers which are activated by IR light are typically activated at wavelengths of from greater than 600 nm to less than 1,000 nm, or such as from 700 nm to 900 nm, or such as from 750 nm to 850 nm. Such IR activated sensitizers include, but are not limited to infrared squarylium dyes, and carbocyanine dyes. Such dyes are known in the art and may be made by methods described in the literature. Typically, such dyes are included in the compositions in amounts of from 0.05 wt % to 3 wt %, or such as from 0.5 wt % to 2 wt %, or such as from 0.1 wt % to 1 wt % of the composition.

Reducing agents also may be used in the imaging compositions. Compounds which may function as reducing agents include, but are not limited to, one or more quinone compounds such as pyrenequinones such as 1,6-pyrenequinone and 1,8-pyrenequinone; 9,10-anthrquinone, 1-chloroanthraquinone, 2-chloro-anthraquinone, 2-methylanthrquinone, 2-ethylanthraquinone, 2-tert-butylanthraquinone, octamethylanthraquinone, 1,4-naphthoquinone, 9,10-phenanthrenequinone, 1,2-benzaanthrquinone, 2,3-benzanthraquinone, 2-methyl-1,4-naphthoquinone, 2,3-dichloronaphthoquinone, 1,4-dimethylanthraquinone, 2,3-dimethylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione.

Other compounds which may function as reducing agents include, but are not limited to, acyl esters of triethanolamines having a formula:

$$N(CH_2CH_2OC(O)—R_{11})_3 \qquad (III)$$

where $R_{11}$ is alkyl of 1 to 4 carbon atoms, and 0 to 99% of a $C_1$ to $C_4$ alkyl ester of nitrilotriacetic acid or of 3,3',3"-nitrilotripropionic acid. Examples of such acyl esters of triethanolamine are triethanolamine triacetate and dibenzylethanolamine acetate.

One or more reducing agent may be used in the imaging compositions to provide the desired color or shade change. Typically, one or more quinone is used with one or more acyl ester of triethanolamine to provide the desired reducing agent function. Reducing agents may be used in the compositions in amounts of from 0.05 wt % to 50 wt %, or such as from 5 wt % to 40 wt %, or such as 20 wt % to 35 wt %.

Suitable color formers include, but are not limited to, leuco-type compounds. Such leuco-type compounds include, but are not limited to, aminotriarylmethanes, aminoxanthenes, aminothioxanthenes, amino-9,10-dihydroacridines, aminophenoxazines, aminophenothiazines, aminodihydrophenazines, antinodiphenylmethines, leuco indamines, aminohydrocinnamic acids such as cyanoethanes and leuco methines, hydrazines, leuco indigoid dyes, amino-2,3-dihydroanthraquinones, tetrahalo-p,p'-biphenols, 2(p-hydroxyphenyl)-4,5-diphenylimidazoles, and phenethylanilines. Typically, the aminotriarylmethane leuco dyes, such as the o-methyl substituted dyes, are used. The o-methyl substitution is believed to make the structure non-planar and more resistant to oxidation than many other leuco-type dyes. Color formers are included in amounts of from 0.1 wt % to 5 wt %, or such as from 0.25 wt % to 3 wt %, or such as from 0.5 wt % to 2 wt % of the composition.

Oxidizing agents also may be included in the imaging compositions to influence the color or shade change. Typically such oxidizing agents are used in combination with one or more color former. Compounds, which may function as oxidizing agents include, but are not limited to, hexaarylbiimidazole compounds such as 2,4,5,2',4',5'-hexaphenylbiimidazole, 2,2',5-tris(2-chlorophenyl)-4-(3,4-dimethoxyphenyl)-4,5-diphenylbiimidazole (and isomers), 2,2'-bis(2-ethoxyphenyl)-4,4',5,5',-tetraphenyl-1,1'-bi-1H-mimidazole, and 2,2'-di-1-naphthalenyl-4,4',5,5'-tetraphenyl-1'-bi-1H-imidazole. Other suitable compounds include, but are not limited to, halogenated compounds with a bond dissociation energy to produce a first halogen as a free radical of not less than 40 kilocalories per mole, and having not more than one hydrogen attached thereto; a sulfonyl halide having a formula: $R'—SO_2—X'$ where R' is an alkyl, alkenyl, cycloalkyl, aryl, alkaryl, or aralkyl and X' is chlorine or bromine; a sulfenyl halide of the formula:

R"—S—X" where R" and X" have the same meaning as R' and X' above; tetraaryl hydrazines, benzothiazolyl disulfides, polymetharylaldehydes, alkylidene 2,5-cyclohexadien-1-ones, azobenzyls, nitrosos, alkyl (T1), peroxides, and haloamines. Typical examples of suitable halogenated sulfones include tribromomethyl aryl sulfones such as tribromomethylphenyl sulfone, tribromomethyl p-tolyl sulfone, tribromomethyl 4-chlorophenyl sulfone, tribromomethyl 4-bromophenyl sulfone, and tribromomethyl phenyl sulfone. Such compounds are included in the compositions in amounts of from 0.25 wt % to 10 wt %, or such as from 0.5 wt % to 5 wt %, or such as from 1 wt % to 3 wt % of the composition. Methods are known in the art for preparing the compounds and many are commercially available.

Film forming polymers may be included in the imaging compositions to function as binders for the compositions. Any film forming binder may be employed in the formulation of the compositions provided that the film forming polymers do not adversely interfere with the desired color or shade change, and have a $T_g$ of from −60° C. to greater than 80° C. or such as from −60° C. to 80° C., or such as from greater than −60° C. to greater than 40° C., or such as from 0° C. to 35° C. The film forming polymers are included in amounts of from 10 wt % to 90 wt %, or such as from 15 wt % to 70 wt %, or such as from 25 wt % to 60 wt % of the compositions. Typically, the film forming polymers are derived from a mixture of acid functional monomers and non-acid functional monomers. Examples of suitable acid functional monomers include (meth)acrylic acid, maleic acid, fumaric acid, citraconic acid, 2-acrylamido-2-methylpropanesulfonic acid, 2-hydroxyethyl acrylol phosphate, 2-hydroxypropyl acrylol phosphate, and 2-hydroxy-alpha-acrylol phosphate.

Examples of suitable non-acid functional monomers include esters of (meth)acrylic acid such as methyl acrylate, 2-ethyl hexyl acrylate, n-butyl acrylate, n-hexyl acrylate, methyl methacrylate, hydroxyl ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decaamethylene glycol dimethacrylate, 1,4-cyclohexanediol diacrylate, 2,2-dimethyylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2,2-di(p-hydroxyphenyl)-propane dimethacrylate, triethylene glycol dimethacrylate, polyoxypropyltrimethylol propane triacrylate, ethylene glycol dimethacrylate, butylenes glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate; styrene and substituted styrene such as 2-methyl styrene and vinyl toluene and vinyl esters such as vinyl acrylate and vinyl methacrylate.

When the film forming polymer has a $T_g$ of −60° C. to 0° C., the film forming polymers typically have from 0.1 wt % to 6 wt % of the total weight of the polymer at least one carboxy functional monomer, or such as from 0.5 wt % to 6 wt %, or such as from 1 wt % to 5 wt % of at least one carboxy functional monomer. When the film forming polymer has a Tg of greater than 0° C. to greater than 80° C., and one or more bases are included in the composition to maintain a pH range of 3 to 11 or such as from 8 to 11, the polymer may optionally include, as polymerized units, carboxy functional monomers in amounts of from 0.1 wt % to 6 wt %, based on the total weight of the dry film forming polymer, or such as from 0.5 wt % to 6 wt %, or such as from 0.1 wt % to 5 wt % of the total weight of the dry film forming polymer.

Other suitable polymers include, but are not limited to, nonionic polymers such as polyvinyl alcohol, polyvinyl pyrrolidone, hydroxyl-ethylcellulose, and hydroxyethylpropyl methylcellulose. Also polymers such as polyvinyl acetate may be used.

Binder polymers may be prepared via bulk and solution polymerization, and by aqueous dispersion, suspension, and emulsion polymerization, or any other method that produces the desired polymer, either dispersed in water or capable of being dispersed in water. Such methods are well known in the art.

Amphoteric surfactants are included in the compositions to function as release agents such that the compositions may be peeled from a work piece. They also stabilize particles of the polymers during and after aqueous emulsion polymerization, or other dispersion polymerizations. Suitable amphoteric surfactants are those which have weakly acidic functionalities such as carboxy functionalities, and have isoelectric points of from pH 3 to pH 8. Such amphoteric surfactants are included in the imaging compositions in amounts of from 0.1 wt % to 6 wt %, or such as from 0.25 wt % to 5 wt %, or such as from 0.5 wt % to 4 wt % of the film forming binder polymer. Examples of suitable amphoteric surfactants include, but are not limited to, amino carboxylic acids, amphoteric imidazoline derivatives, betaine, fluorocarbon and siloxane versions thereof and mixtures thereof.

Any of the aminocarboxylic acids may have carboxy moieties present in either protonated form or in carboxylate form. Where more than one carboxy group is present on a molecule, those carboxy groups may all be in protonated form, in carboxylate form, or they may be present as some mixture of protonated and carboxylate forms. Furthermore, the ratio of protonated to unprotonated carboxy moieties may vary from one molecule to another, otherwise identical, molecule in a given system. Cations present as counter ions for the carboxylate moieties include cations of lithium, sodium, potassium, amines (i.e., ammonium cations derived from protonation or other quaternary substitution of amines), zinc, zirconium, calcium, magnesium, and aluminum. Any of the aminocarboxylic acids may have amino moieties present in either protonated (ammonium) or free amine form (i.e., as deprotonated primary, secondary, or tertiary amine). Where more than one amino group is present on a molecule, those amino groups may all be in protonated form, in free amine form, or they may be present as some mixture of protonated and free amine forms. Again, the ratio of protonated to unprotonated amine moieties may vary from one molecule to another, otherwise identical, molecule in a given system. Anions present as counter ions for the ammonium moieties include chloride, bromide, sulfate, carbonate, hydroxide, formate, acetate, propionate and other carboxylate anions.

Suitable aminocarboxylic acids include: α-aminocarboxylic acids having the general formula $R_{12}$—NH—$CH_2COOH$, where $R_{12}$=$C_4$–$C_{20}$ linear or branched, alkyl, alkenyl, or fluoro or silicone functional hydrophobe group; and β-aminocarboxylic acids having the general structures: $R_{12}$—NH—$CH_2CH_2COOH$ and $R_{12}N(CH_2CH_2COOH)_2$, where $R_{12}$=$C_4$–$C_{20}$ linear or branched, alkyl, alkenyl, or fluoro or silicone functional hydrophobe group, β-aminocarboxylic acids are available from Henkel Corporation, King of Prussia, Pa., under the name DERIPHAT™. Unless otherwise stated, the DERIPHAT™ ampholytes have the general formula $R_{13}$—$NHCH_2CH_2COOH$, where $R_{13}$=residue of coconut fatty acids, residue of tallow fatty acids, lauric acid, myristic acid, oleic acid, palmitic acid, stearic acid, linoleic acid, other $C_4$–$C_{20}$ linear or branched, alkyl, alkenyl, and mixtures thereof DERIPHAT™ ampholytes useful in the present invention include: sodium-N-coco-β-aminopropionate (DERIPHAT™ 151, flake 97% active); N-coco-β-aminopropionic acid (DERPHAT™ 151C, 42% solution in water); N-lauryl/myristyl-β-amino-propionic acid (DERIPHAT™ 17° C., 50% in water); disodium-N-tallow-β-iminodipropionate, $R_{14}N(CH_2CH_2COONa)_2$, (DERIPHAT™ 154, flake 97% active); disodium-N-lauryl-β-iminodipropionate (DERIPHAT™ 160, flake 97% active); and partial sodium salt of N-lauryl-β-iminodipropionic acid, $R_{14}N(CH_2CH_2COOH)(CH_2CH_2COONa)$, (DERIPHAT™ 16° C., 30% in water). Useful polyaminocarboxylic acids include $R_{14}C(=O)NHC_2H_4(NHC_2H_4)_yNHCH_2COOH$ and $R_{14}$-substituted ethylenediaminetetraacetic acid (EDTA), where $R_{14}$=$C_4$–$C_{20}$ linear or branched, alkyl or alkenyl, and y=0–3.

Amphoteric imidazoline derivatives useful in the claimed invention include those derived from variously substituted 2-alkyl-2-imidazolines and 2-alkenyl-2-imidazolines which have nitrogen atoms at the 1 and 3 positions of the five-membered ring and a double bond in the 2,3 position. The alkyl or alkenyl group may be a $C_4$–$C_{20}$ linear or branched chain. The amphoteric imidazoline derivatives are produced via reactions in which the imidazoline ring opens hydrolytically under conditions allowing further reaction with such alkylating agents as sodium chloroacetate, methyl (meth) acrylate, ethyl (meth)acrylate, and (meth)acrylic acid. Useful amphoteric surfactants derived from the reaction of 1-(2-hydroxyethyl)-2-($R_1$)-2-imidazolines with acrylic acid or acrylic acid esters, where $R_{15}$=residue of coconut fatty acids, are:

cocoamphopropionate, $R_{15}$—$C(=O)NHCH_2CH_2N(CH_2CH_2OH)(CH_2CH_2COONa)$;

cocoamphocarboxypropionic acid, $R_{15}$—$C(=O)NHCH_2CH_2N(CH_2CH_2COOH)(CH_2CH_{20}CH_2CH_2COOH)$;

cocoamphocarboxypropionate, $R_{15}$—$C(=O)NHCH_2CH_2N(CH_2CH_2COONa)(CH_2CH_{20}CH_2CH_2COONa)$;

cocoamphoglycinate, $R_{15}$—$(=O)NHCH_2CH_2N(CH_2CH_{20}H)(CH_2COONa)$; and cocoamphocarboxyglycinate, $[R_{15}$—$(=O)NHCH_2CH_2N^+(CH_2CH_2OH)(CH_2COONa)_2]OH^-$.

Surface-active inner salts containing at least one quaternary ammonium cation and at least one carboxy anion are called betaines. The nomenclature for betaines derives from the single compound (trimethylammonio)acetate which is called betaine and exists as an inner salt. Betaines useful as amphoteric surfactants in the claimed invention include compounds of the general formulae: $R_{16}N^+(CH_3)_2CH_2COO^-$; $R_{16}CONHCH_2CH_2CH_2N^+(CH_3)_2CH_2COO^-$; and $R_{16}$—O—$CH_2$—$N^+(CH_3)_2CH_2COO^-$, where $R_{16}$=$C_4$–$C_{20}$ linear or branched, alkyl, alkenyl, or fluoro or silicone functional hydrophobe group. Specific examples of betaines include N-dodecyl-N,N-dimethylglycine and cocamidopropyl betaine and (MONATERIC™ CAB available from Mona Industries).

Typically, when fluorocarbon substituents are attached to amphoteric surfactants, those substituents are perfluoroalky groups, branched or unbranched, having 6 to 18 carbon atoms. However, these substituents may instead be partially fluorinated. They may also bear aryl functionality. Examples of fluorocarbon amphoteric surfactants include fluorinated alkyl FLUORAD™ FC100 and fluorinated alkyl ZONYL™ FSK, produced by 3M and Dupont, respectively.

Typical siloxane functional amphoteric surfactants have, for example, the structures:

(IV)

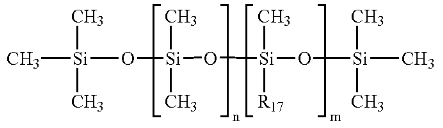

(V)

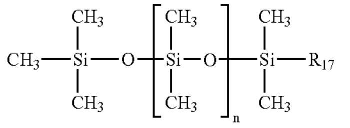

wherein $R_{17}$ represents an amphoteric moiety and m+n=3 to 50. An example is the polyalkyl betaine polysiloxane copolymer ABIL™ B9950 available from Goldschmidt Chemical Corporation.

Macromolecular amphoteric surfactants useful in the claimed invention include: proteins, protein hydrolysates, derivatives of protein hydrolysates, starch derivatives, and synthetic amphoteric oligomers and polymers. Of particular utility are those macromolecular ampholytes bearing carboxy functionality.

Typically the imaging compositions are within a pH range of from 3 to 11 or such as from 4 to 7. Optionally, a base may be employed to maintain the desired pH. To assist in maintaining the imaging compositions within a desired pH range, any suitable base may be used. Examples of such bases include calcium carbonate, zinc oxide, magnesium oxide, calcium hydroxide or mixtures thereof. Bases are present in the imaging compositions in amounts of greater than 0.2 moles/100 gm of polymer to 2 moles/100 gm of polymer, or such as from 0.3 moles/100 gm of polymer to 1.75 moles/100 gm of polymer, or such as from 0.4 moles/100 gm of polymer to 1.5 moles/100 gm of polymer.

Optionally, polyvalent metal cations are included to form an ionic bond with a carboxylic acid group on one or more of the monomers which compose the polymers. Any suitable polyvalent cation may be used which forms an ionic bond with the carboxylic acid groups to achieve cross-linking. Such cations include, but are not limited to, $Mg^{2+}$, $Sr^{2+}$, $Ba^{2+}$, $Ca^{2+}$, $Zn^{2+}$, $Al^{3+}$, $Zr^{4+}$ or mixtures thereof. Such polyvalent cations are included in the imaging compositions in amounts of 0.001 to 0.1 moles/100 gm of dry polymer, or such as from 0.01 to 0.08 moles/100 gm of dry polymer, or such as from 0.02 to 0.05 moles/100 gm of dry polymer.

When one or more bases containing polyvalent cations are included in the compositions in combination with another source of polyvalent cations, the sum of the amounts of base and polyvalent metal cation is greater than 0.2 to 2 moles/100 gm of polymer, or such as from 0.3 to 1.75 moles/100 gm of polymer, or such as from 0.4 to 1.5 moles/100 gm of polymer.

Optionally, antioxidants may be included in the imaging compositions to stabilize the color or shade change of the imaging compositions to ambient radiation. The antioxidants are believed to arrest the oxidation of color formers when the compositions are exposed to ambient radiation. Arresting the oxidation of the color formers inhibits further color or shade change in the compositions from ambient radiation. Accordingly, a color or shade contrast between the portions of the composition marked by exposure to low intensity energy, such as by a laser, and the portions not exposed to the low intensity energy, but only to ambient radiation, are maintained or stabilized. Any suitable antioxidant which arrests the oxidation of color formers may be used. Examples of such antioxidants are hindered phenols and hindered amines.

Hindered phenols include one or two sterically bulky groups bonded to the carbon atom or atoms contiguous to the hydroxyl group-bonded carbon atom to sterically hinder the hydroxyl group. Examples of such hindered phenols are 2,6-di-tert-butyl-4-methylphenol, 2,2'-methylene-bis(4-methyl-6-tertbutylphenol), 2,6-methylene-bis(2-hydroxy-3-tert-butyl-5-methyl-phenyl)4-methylphenol, 2,2'-methylene-bis(4-ethyl-6-tert-butylphenol), 2,6-bis(2'-hydroxy-3'-tert-butyl-5'-methylbenzyl)4-methyl- phenol, 2,4,4-trimethylphenyl-bis(2-hydroxy-3,5-dimethylphenyl) methane, 2,2'-methylene-bis[4-methyl-6-(1-methylcyclohexyl)]phenol, 2,5-di-tert-butyl-4-methoxyphenol, 4,4'-butylidenebis(6-tert-butyl-3-methylphenol), and 1,1,3-tris(2-methyl-4-hydroxy-5-tertbutylphenyl)butane.

Hindered amines include one or two sterically bulky groups bonded to the carbon atom or atoms adjacent to a nitrogen atom to sterically hinder the nitrogen. The nitrogen itself may have bulky groups bonded to it. Examples of suitable hindered amines include 2,2,6,6-tetraalkylpiperidine compounds including N-substituted 2,2,6,6-tetraalkylpiperidine compounds. Such compounds contain a group having a formula:

(VI)

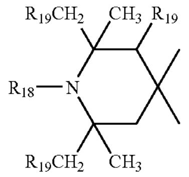

where $R_{18}$ hydrogen, $(C_1-C_{18})$alkyl, $(C_1-C_6)$hydroxyalkyl, cyanomethyl, $(C_3-C_8)$alkenyl, $(C_3-C_8)$alkynyl, $(C_7-C_{12})$ aralkyl which may be unsubstituted or substituted in the alky moiety by hydroxyl, $(C_1-C_8)$alkanoyl or $(C_3-C_5)$alkenoyl; and $R_{19}$ is hydrogen or methyl.

The antioxidants are micro-encapsulated in any suitable microcapsule formulation and by any suitable micro-encapsulating method. The microcapsule prevents mutual contact of the antioxidant contained in the microcapsule with the other materials outside of the microcapsule by the isolating action of the microcapsule wall at room and storage temperatures. The microcapsules have increased permeability for their contents upon application of sufficient heat or pressure. Permeation may be controlled by selecting suitable microcapsule wall materials and microcapsule core materials. Examples of suitable wall materials include polyurethanes, polyureas, polyamides, polyesters, polycarbonates and combinations thereof. Typically, polyurethanes and polyureas are used to make the microcapsule wall.

The microcapsules may be formed by emulsifying the core material containing the antioxidant and subsequently forming a wall around drops of the emulsified core material. In preparation of the microcapsule, a reactant which forms the wall is added to the inside or outside of the drops. Specific procedures for forming microcapsules are described, for example, in U.S. Pat. No. 3,726,804, U.S. Pat. No. 3,796,696, U.S. Pat. No. 4,962,009, and U.S. Pat. No. 5,244,769, which are hereby incorporated herein in their entireties by reference.

Solvents suitable for forming the emulsion with the antioxidant include, but are not limited to, organic compounds such as phosphoric acid esters, phthalic acid esters, (meth)acrylic acid esters, other carboxylic acid esters, fatty acid amides, alkylated biphenyls, alkylated terphenyls, alkylated naphthalenes, diarylethanes, chlorinated paraffins, and mixtures thereof.

Auxiliary solvents may be added to the above-described organic solvents. Such solvents include, but are not limited to, ethyl acetate, isopropyl acetate, butyl acetate, methylene chloride, cyclohexanone, and mixtures thereof.

Protective colloids or surface active agents may be added to the aqueous phase for stabilizing the emulsified drops. Water-soluble polymers may be used as the protective colloids. An example of a suitable water-soluble polymer is carboxyl-modified polyvinyl alcohol.

The size of the microcapsules may vary in size. Typically, the microcapsules have an average diameter of 0.5 μm to 15 μm, or such as from 0.75 μm to 10 μm, or such as from 1 μm to 5 μm.

Chain transfer agents may be used in the imaging compositions. Such chain transfer agents function as accelerators. One or more chain transfer agents may be used in the imaging compositions. Chain transfer agents or accelerators increase the rate at which the color or shade change occurs after exposure of energy. Any compound which accelerates the rate of color or shade change may be used. Accelerators may be included in the compositions in amounts of from 0.01 wt % to 25 wt %, or such as from 0.5 wt % to 10 wt %. Examples of suitable accelerators include onium salts, and amines.

Suitable onium salts include, but are not limited to, onium salts in which the onium cation is iodonium or sulfonium such as onium salts of arylsulfonyloxybenzenesulfonate anions, phosphonium, oxysulfoxonium, oxysulfonium, sulfoxonium, ammonium, diazonium, selononium, arsonium, and N-substituted N-heterocyclic onium in which N is substituted with a substituted or unsubstituted saturated or unsaturated alkyl or aryl group.

The anion of the onium salts may be, for example, chloride, or a non-nucleophilic anion such as tetrafluoroborate, hexafluorophosphate, hexafluoroarsenate, hexafluoroantimonate, triflate, tetrakis-(pentafluorophosphate) borate, pentafluoroethyl sulfonate, p-methyl-benzyl sulfonate, ethylsulfonate, trifluoromethyl acetate and pentafluoroethyl acetate.

Examples of typical onium salts are diphenyl iodonium chloride, diphenyliodonium hexafluorophosphate, diphenyl iodonium hexafluoroantimonate, 4,4'-dicumyliodonium chloride, dicumyliodonium hexafluorophosphate, N-methoxy-a-picolinium-p-toluene sulfonate, 4-methoxybenzene-diazonium tetrafluoroborate, 4,4'-bis-dodecylphenyliodonium-hexafluoro phosphate, 2-cyanoethyl-triphenylphosphonium chloride, bis-[4-diphenylsulfonionphenyl]sulfide-bis-hexafluoro phosphate, bis-4-dodecylphenyliodonium hexafluoroantimonate and triphenylsulfonium hexafluoroantimonate.

Suitable amines to function as accelerators include, but are not limited to primary, secondary and tertiary amines such as methylamine, diethylamine, triethylamine, heterocyclic amines such as pyridine and piperidine, aromatic amines such as aniline and n-phenyl glycine, quaternary ammonium halides such as tetraethylammonium fluoride, and quaternary ammonium hydroxides such as tetraethylammonium hydroxide. The triethanolamines of formula III also have accelerator activity.

Plasticizers also may be included in the compositions. Any suitable plasticizer may be employed. Plasticizers may be included in amounts of from 0.5 wt % to 15 wt %, or such as from 1 wt % to 10 wt % of the compositions. Examples of suitable plasticizers include phthalate esters such as dibutylphthalate, diheptylphthalate, dioctylphthalate and diallylphthalate, glycols such as polyethylene glycol and polypropylene glycol, glycol esters such as triethylene glycol diacetate, tetraethylene glycol diacetate, and dipropylene glycol dibenzoate, phosphate esters such as tricresylphosphate, triphenylphosphate, amides such as p-toluenesulfoneamide, benzenesulfoneamide, N-n-butylacetoneamide, aliphatic dibasic acid esters such as diisobutyl-adipate, dioctyladipate, dimethylsebacate, dioctylazelate, dibutylmalate, triethylcitrate, tri-n-butylacetylcitrate, butyl-laurate, dioctyl-4,5-diepoxycyclohexane-1,2-dicarboxylate, and glycerine triacetylesters.

One or more flow agents also may be included in the compositions. Flow agents are compounds, which provide a smooth and even coating over a substrate. Flow agents may be included in amounts of from 0.05 wt % to 5 wt % or such as from 0.1 wt % to 2 wt % of the compositions. Suitable flow agents include, but are not limited to, copolymers of alkylacrylates. An example of such alkylacrylates is a copolymer of ethyl acrylate and 2-ethylhexyl acrylate.

Optionally, one or more organic acids may be employed in the imaging compositions. Organic acids may be used in amounts of from 0.01 wt % to 5 wt %, or such as from 0.5 wt % to 2 wt %. Examples of suitable organic acids include formic acid, acetic acid, propionic acid, butyric acid, valeric acid, caproic acid, caprylic acid, capric acid, lauric acid, phenylacetic acid, benzoic acid, phthalic acid, isophthalic acid, terephthalic acid, adipic acid, 2-ethylhexanoic acid, isobutyric acid, 2-methylbutyric acid, 2-propylheptanoic acid, 2-phenylpropionic acid, 2-(p-isobutylphenyl)propionic acid, and 2-(6-methoxy-2-naphthyl)propionic acid.

Optionally, one or more non-ionic and ionic surfactants may be used in the imaging compositions. Surfactants may be included in the compositions in amounts of from 0.5 wt % to 10 wt %, or such as from 1 wt % to 5 wt % of the composition. Examples of suitable non-ionic surfactants include polyethylene oxide ethers, derivatives of polyethylene oxides, aromatic ethoxylates, acetylenic ethylene oxides and block copolymers of ethylene oxide and propylene oxide. Examples of suitable ionic surfactants include alkali metal, alkaline earth metal, ammonium, and alkanol ammonium salts of alkyl sulfates, alkyl ethoxy sulfates, and alkyl benzene sulfonates.

Thickeners may be included in the imaging compositions in conventional amounts. Any suitable thickener may be incorporated in the imaging compositions. Typically, thickeners range from 0.05 wt % to 10 wt %, or such as from 1 wt % to 5 wt % of the compositions. Conventional thickeners may be employed. Examples of suitable thickeners include low molecular weight polyurethanes such as having at least three hydrophobic groups interconnected by hydrophilic polyether groups. The molecular weight of such thickeners ranges from 10,000 to 200,000. Other suitable thickeners include hydrophobically modified alkali soluble emulsions, hydrophobically modified hydroxyethyl cellulose and hydrophobically modified polyacrylamides.

Rheology modifiers may be included in conventional amounts. Typically rheology modifiers are used in amounts of from 0.5 wt % to 20 wt %, or such as from 5 wt % to 15 wt % of the compositions. Examples of rheology modifiers include vinyl aromatic polymers and acrylic polymers.

Diluents may be included in the imaging compositions to provide a vehicle or carrier for the other components. Diluents are added as needed. Solid diluents or fillers are typically added in amounts to bring the dry weight of the compositions to 100 wt %. Examples of solid diluents are celluloses. Liquid diluents or solvents are employed to make solutions, suspensions, dispersions or emulsions of the active components of the compositions. The solvents may be aqueous or organic, or mixtures thereof. Examples of organic solvents include alcohols such as methyl, ethyl and isopropyl alcohol, diisopropyl ether, diethylene glycol dimethyl ether, 1,4-dioxane, terahydrofuran or 1,2-dimethoxy propane, and ester such as butyrolactone, ethylene glycol carbonate and propylene glycol carbonate, an ether ester such as methoxyethyl acetate, ethoxyethyl acetate, 1-methoxypropyl-2-acetate, 2-methoxypropyl-1-acetate, 1-ethoxypropyl-2-acetate and 2-ethoxypropyl-1-acetate, ketones such as acetone and methylethyl ketone, nitriles such as acetonitrile, propionitrile and methoxypropionitrile, sulfones such as sulfolan, dimethylsulfone and diethylsulfone, and phosphoric acid esters such as trimethyl phosphate and triethyl phosphate. Solvents also include coalescing solvents such as ethers. Examples of such ethers include ethylene glycol phenyl ether and tripropylene glycol n-butyl ether.

Additional optional components include, but are not limited to, defoaming agents, coalescing monomers, preservatives and mold inhibitors. They are included in conventional amounts.

The imaging compositions may be prepared by any suitable method. One method is to solubilize or disperse the water-insoluble imaging components and other water-insoluble components in a coalescing solvent. Any solvent which disperses or solubilizes the water-insoluble imaging components may be used. Such coalescing solvents include, but are not limited to, ester alcohols and glycol ethers. The solution or dispersion is then emulsified with the aqueous base portion containing the polymer binder and other water-soluble components. Conventional emulsification methods may be used to prepare the oil in water emulsion imaging compositions.

The imaging compositions may be in the form of a concentrate. In such concentrates, the solids content may range from 80 wt % to 98 wt %, or such as from 85 wt % to 95 wt %. Concentrates may be diluted with water, one or more organic solvents, or a mixture of water and one or more organic solvents. Concentrates may be diluted such that the solids content ranges from 5 wt % to less than 80 wt %, or such as from 10 wt % to 70 wt %, or such as from 20 wt % to 60 wt %.

Upon application of a sufficient amount of energy to an imaging composition, a photofugitive or a phototropic response occurs. The amount of energy may be from 0.2 $mJ/cm^2$ and greater, or such as from 0.2 $mJ/cm^2$ to 100 $mJ/cm^2$, or such as from 2 $mJ/cm^2$ to 40 $mJ/cm^2$, or such as from 5 $mJ/cm^2$ to 30 $mJ/cm^2$.

The imaging compositions undergo color or shade changes with the application of intensities of 5 mW of energy or less (i.e., greater than 0 mW), or such as from less than 5 mW to 0.01 mW, or such as from 4 mW to 0.05 mW, or such as from 3 mW to 0.1 mW, or such as from 2 mW to 0.25 mW or such as from 1 mW to 0.5 mW. Typically, such intensities are generated with light sources in the visible range. Other photosensitizers and energy sensitive components, which may be included in the imaging compositions, may elicit a color or shade change upon exposure to energy from light outside the visible range. Such photosensitizers and energy sensitive compounds are included to provide a more pronounced color or shade contrast with that of the response caused by the application of 5 mW or less. Typically photosensitizers and energy sensitive compounds, which form the color or shade contrast with photosensitizers activated by energy at powers of 5 mW or less, elicit a phototropic response.

While not being bound by theory, one or more color or shade changing mechanisms are believed involved to provide a color or shade change after energy is applied. For example, when a photofugitive response is induced, the one or more sensitizers releases a free radical to activate the one or more reducing agents to reduce the one or more sensitizers to affect the color or shade change in the composition. When a phototropic response is induced, for example, free radicals from one or more sensitizer induces a redox reaction between one or more leuco-type compound and one or more oxidizing agent to affect the color or shade change. Some formulations have combinations of photofugitive and phototropic responses. For example, exposing a composition to artificial energy, i.e., laser light, generates a free radical from one or more sensitizers which then activates one or more reducing agents to reduce the sensitizer to cause a photofligitive response, and then exposing the same composition to ambient light to cause one or more oxidizing agents to oxidize one or more leuco-type compounds.

Any suitable energy source may be used to induce the photo fugitive or phototropic response. Examples of suitable energy sources include, but are not limited to, lasers, including lasers generated from hand held lasers and 3-D imaging systems, and flash lamps. Operating wavelengths of lasers may range from IR through UV. An example of a suitable laser is a neodymium (Nd) doped YAG laser operating at frequencies of 473 nm and 532 nm.

The imaging compositions provide a rapid and efficient means of changing the color or shade of a work piece or of placing an image on a work piece such as aeronautical ships, marine vessels and terrestrial vehicles, or for forming images on textiles. After the imaging composition is applied a sufficient amount of energy is applied to the imaging composition to change its color or shade. Generally, the color or shade change is stable. Stable means that the color or shade change lasts at least 10 seconds, or such as from 20 minutes to 2 days, or such as from 30 minutes to 8 hours. Certain formulations which are sensitive to light at 473 nm are stable indefinitely under controlled conditions where blue light is filtered.

Alternatively, the energy may be selectively applied to form an imaged pattern, and the work piece may be further processed to form a final article. For example, the image may be used as a mark or indicator to drill holes for fasteners to join parts together such as in the assembly of an automobile, to form an outline for making a logo or picture on an airplane body, or to align segments of marine vessel parts. Since the compositions may be promptly applied to a work piece and the image promptly formed by selective application of energy to create color or shade contrast, workers no longer need to work adjacent the work piece to mark laser beam images with hand-held ink markers or tape in the fabrication of articles. Accordingly, the problems of blocking laser beams caused by workers using the hand-held markers and tape are eliminated.

Further, the reduction of human error increases the accuracy of marking. This is important when the marks are used to direct the alignment of parts such as in aeronautical ships, marine vessels and terrestrial vehicles where accuracy in fabrication is critical to the reliable and safe operation of the machine.

The compositions are suitable for industrial assembly line fabrication of numerous articles. For example, a substrate such as an airplane body may pass to station 1 where the composition is applied to a surface of the airplane body to cover the desired portions or the entire surface. The composition may be coated on the body by standard spray coating or roller coating procedures or brushed on the surface. The coated airplane body is then transferred to station 2 where the energy is applied over the entire surface or is selectively applied to form a pattern. While the first airplane body is at station 2, a second body may be moved into station 1 for coating. The energy may be applied using laser beams, which induce a color or shade change on the surface of the airplane body. Since manual marking by workers is eliminated, the imaged airplane body is then promptly transferred to station 3 for further processing such as developing away or stripping unwanted portions of the coating, or drilling holes in the body for fasteners for the alignment of parts at other stations. Further, the elimination of workers at the imaging station improves the accuracy of image formation since there are no workers to interfere with the laser beams pathway to their designated points on the coated airplane body. Accordingly, the compositions provide for more efficient manufacturing than many conventional imaging and alignment processes. Additionally, since pattern formation may be performed using low powers of light sources (i.e., 5 mW or less) visual hazards to workers is eliminated or at least reduced.

EXAMPLE 1

Phototropic Imaging Composition

The phototropic imaging composition with components disclosed in the table below are prepared at room temperature under red light.

TABLE 1

| Component | Percent Weight |
|---|---|
| Film forming acrylic polymer | 25 |
| Calcium carbonate | 20 |
| o-chloro-hexaarylbiimidazole | 6 |
| 2',4',5',7'-tetrabromo-3,4,5,6-tetrachlorofluorescein disodium salt | 0.5 |
| 2,2-methylene-bis(4-methyl-6-tertbutylphenol) | 0.5 |
| Leuco Crystal Violet | 1 |
| Polyalky betaine polysiloxane copolymer | 2 |
| Ethylene glycol phenyl ether | 10 |
| Water | 35 |

The acrylic polymer is a latex polymer which may be prepared by known methods in the art, or may be obtained commercially from Rohm and Haas Company of Philidelphia, Pa. under the tradename RHOPLEX™ E-1801. The polyalkyl betaine polysiloxane copolymer is mixed with the acrylic polymer in water to form an aqueous suspension. Calcium carbonate is added to the aqueous suspension to provide a pH of from 8 to 11.

Leuco crystal violet, 0-chloro-hexaarylbiimidazole, 2',4', 5',7'-tetrabromo-3,4,5,6-tetrachlorofluorescein disodium salt and the micro-encapsulated 2,2'-methylene-bis(4-methyl-6-tertbutylphenol) are mixed with the ethylene glycol phenyl ether solvent to form a uniform organic solution. The microcapsules of 2,2'-methylene-bis(4-methyl-6-terbutylphenol) are prepared according to the method described in Example 7 below.

The aqueous suspension containing the film forming acrylic polymer and the polyalkyl betaine polysiloxane copolymer amphoteric surfactant is mixed with the organic solution containing the imaging components to form an oil in water emulsion. Emulsification is performed using a conventional emulsifier.

The imaging composition is coated on a work piece, such as an airplane fuselage, using a paint spray gun and air dried at room temperature. The dried imaging composition is then selectively exposed to a laser using a 3D, 532 nm Nd:YAG laser apparatus at a power of 5 mW for 5 seconds to form a pattern on the imaging composition for forming apertures in the airplane fuselage for the insertion of support pins. The selectively exposed portions of the imaging composition darken to a violet color to create a contrast between the exposed and non-exposed portions of the imaging composition.

The imaging composition coated on the fuselage is then heated to 40° C. to release the micro-encapsulated 2,2'-methylene-bis(4-methyl-6-tertbutylphenol) to prevent further oxidation of the leuco crystal violet to stabilize the violet colored pattern on the imaging composition.

Workers then form the apertures in the fuselage as directed by the violet colored pattern. After the apertures are formed the imaging composition is peeled from the fuselage. No developers or solvents are used to remove the imaging composition.

EXAMPLE 2

Photofugitive Composition

The components listed in the table below are combined to at room temperature under red light to form a photofugitive imaging composition.

TABLE 2

| Components | Weight Percent |
|---|---|
| Copolymer of styrene and acrylic acid | 25 |
| Calcium carbonate | 20 |
| Cyclopentanone-2,5-bis [[4-(diethylamino)phenyl]methylene]- | 0.5 |
| Leuco Crystal Violet | 1 |
| o-chloro-hexaarylbiimidazole | 6.5 |
| 1,2-naphthoquinone | 0.5 |
| Triethanolamine triacetate | 1.5 |
| Polyalkyl betaine polysiloxane copolymer | 2 |
| Ester alcohol | 8 |
| Water | 35 |

Copolymers of styrene and acrylic acid are known and methods for preparing them may be found in the literature. They are also commercially available such as under the tradename RHOPLEX™ P-376, which is obtainable from Rohm and Haas Company. The copolymer is mixed in water with the polyalkyl betaine polysiloxane copolymer to form an aqueous suspension. Calcium carbonate is added to the suspension to maintain a pH of 8 to 11.

The imaging components: leuco crystal violet, o-chloro-hexaarylbiimidazole, 1,2-naphthoquinone, triethanolamine triacetate and cyclopentanone-2,5-bis[[4-(diethylamino)phenyl]methylene]- are mixed together in the ester alcohol to form an organic solution. Ester alcohols are well known and may be found in the literature. Many are commercially available such as TEXANOL™, which may be obtained from Eastman Chemical Co., Kingsport, Tenn.

The aqueous suspension is emulsified with the organic solution using a conventional emulsifier to form an oil in water emulsion.

The emulsion of the imaging composition is spray coated onto an airplane fuselage and air dried at room temperature. Under UV light the dried imaging composition forms a reddish brown color. A pattern is formed on the dried imaging composition by selectively applying a laser using a 3D, 532 nm Nd:YAG laser at 5 mW for 5 seconds. The portions of the imaging composition exposed to the laser fade to a light gray color to create a contrast with the reddish brown portions which are not exposed.

Workers form apertures in the fuselage for the insertion of support pins as directed by the pattern on the imaging composition. After the apertures are formed the imaging composition is peeled from the fuselage and discarded. No developers or organic solvents are used to remove the imaging composition.

EXAMPLE 3

Phototropic Composition

The following composition is prepared at room temperature under red light.

TABLE 3

| Component | Weight Percent |
|---|---|
| Vinyl acetate/acrylic copolymer emulsion | 25 |
| 2-alkyl-2-imidazoline | 15 |
| Vinyl aromatic polymer | 5 |
| Leuco Crystal Violet | 1 |
| Tribromo methyl phenyl sulfone | 6.5 |
| 2',4',5',7'-tetraiodo-3,4,5,6-tetrachlorofluorescein disodium salt | 0.5 |
| 2,2'-methylene-bis(4-methyl-6-tertbutylphenol) | 2 |
| Ethylene glycol phenyl ether | 10 |
| Water | 35 |

The vinyl acetate/acrylic copolymer is known in the art and methods of preparing it are well known. Such copolymers also are commercially available under the trade-name ROVACE™ 661, which is obtainable from Rohm and Haas Company. The copolymer, vinyl aromatic polymer, and the 2-alky-2-imidazoline are mixed in water to form an aqueous emulsion.

The imaging components: leuco crystal violet, tribromo methyl phenyl sulfone, 2',4',5',7'-tetraiodo-3,4,5,6-tetrachlorofluorescein disodium salt, and micro-encapsulated 2,2'-methylene-bis(4-methyl-6-tertbutylphenol) are solubilized in ethylene glycol phenyl ether to form an organic solution.

The aqueous emulsion and the organic solution are mixed to form an oil in water emulsion imaging composition. Emulsification is performed using a conventional emulsifying apparatus.

The imaging composition is then coated on a surface of an airplane fuselage with a spray paint gun. The imaging composition is air-dried on the fuselage. An outline of a company logo is imaged on the composition coating the fuselage using a 3D, 532 nm Nd:YAG laser at 5 mW. The fuselage is then heated to a temperature of 50° C. to release the micro-encapsulated antioxidant to arrest further oxidation of the leuco crystal violet to stabilize the color contrast between the imaged and non-imaged portions of the imaging composition. The imaging composition is scored along the imaged outline and peeled from the fuselage. The unmasked area is then painted to form the company logo on the fuselage. The remainder of the imaging composition is then peeled from the fuselage. No developer or organic solvents are used to remove the composition from the fuselage.

EXAMPLE 4

Phototropic Composition

A formulation similar to that as disclosed in Example 1 above is prepared under the same conditions and procedures except that the halogenated xanthene compound is 2',4',5',7'-tetraiodofluorescein disodium salt and the micro-encapsulated antixodant is 2,6-di-tert-butyl-4-methylphenol.

The imaging composition is roller coated on an automobile chassis and air-dried. A 3D, 532 nm Nd:YAG laser is used to image an outline of a company logo on the chassis. The chassis is then heated to 35° C. such that the antioxidant is released from the microcapsules to arrest oxidation of the color former to stabilize the color contrast between the laser-exposed portions and non-laser-exposed portions of the imaging composition. Workers score the composition along the imaged line and peel that portion from the chassis. The exposed surface of the chassis is painted. The remainder of the composition is peeled from the chassis.

EXAMPLE 5

Phototropic Composition

An imaging composition similar to that of Example 3 is prepared by the same procedures except that the halogenated xanthene compound is eosin B and the micro-encapsulated antioxidant is 2,6-methylene-bis(2-hydroxy-3-tert-butyl-5-methyl-phenyl)4-methylphenol. It is used to mark an airplane fuselage.

EXAMPLE 6

Photofugitive Composition

An imaging composition similar to that of Example 2 is prepared by the same procedure except that the cyclopentanone is 2,5-bis[(2,3,6,7-tetrahydro-1H,5H-benzo[i,j]quinolizin-9-yl]methylene]-.

The imaging composition is coated on an airplane fuselage and air-dried. The composition is then selectively marked for the location of apertures for the insertion of support pins using a 3D, 532 nm Nd:YAG laser at 5 mW. The sites marked with the laser turn a lighter shade in contrast to the unexposed portions. Workers then make the apertures and the composition is peeled from the fuselage. The fuselage may then be transferred to another station for further processing.

EXAMPLE 7

Micro-encapsulation of 2,2'-methylene-bis(4-methyl-6-tertbutylphenol)

3 gm of 2,2'-methylene-bis(4-methyl-6-tertbutylphenol) and 25 gm of a 75 wt % solution of xylene diisocyanate/trimethylol propane adduct in ethyl acetate are dissolved in a mixed solvent of 22 gm of methylene chloride and 24 gm of tricresyl phosphate. The resulting solution is added to 63 gm of an aqueous 8 wt % solution of carboxyl-modified polyvinyl alcohol and dispersed and emulsified at 20° C. to prepare a liquid emulsion having an average particle diameter of 1 μm. 100 gm of water are added to the emulsion and stirred at 40° C. for 3 hours. Thereafter the emulsion is brought to room temperature and filtered to obtain a liquid dispersion of microcapsules containing 2,2'-methlyene-bis(4-methyl-6-tertbutylphenol).

EXAMPLE 8

Microcapsules of 2,6-di-tertbutyl-4-methylphenol 3 gm of bisphenol A are dissolved in 10 gm of a solvent mixture of acetone and methylene chloride. The resulting solution is added to 30 gm of 2,6-di-tertbutyl-4-methylphenol as the core material to form a primary solution. Thereafter 4 gm of tolylene diisocyanate and 0.05 gm of dibutylin laurate as a catalyst are added to the solution to form a secondary solution. These solutions are prepared at 20° C.

The secondary solution is slowly added with vigorous stirring to a solution of 5 gm of gum arabic in 20 gm of water, whereby an oil in water emulsion having drops of 5 μm to 10 μm average diameter are formed. This is done while cooling the vessel such that the temperature of the system is not increased beyond 20° C.

When the emulsification is finished, 100 gm of water at 40° C. is added to the emulsion with stirring. Thereafter the temperature of the system is gradually increased to 90° C. over a period of 30 minutes. The system is maintained at 90° C. for 20 minutes with stirring to complete the micro-encapsulation of the antioxidant.

EXAMPLE 9

Microcapsules of 2,6-methylene-bis(2-hydroxy-3-tertbutyl-5-methylphenyl)4-methylphenol 4 gm of 4,4'-dihydroxy-diphenylsulfone are dissolved in 15 gm of tetrahydrofuran and the solution is mixed with 20 gm of 2,6-methylene-bis(2-hydroxy-3-tertbutyl-5-methylphenyl)4-methylphenol as the core material to give a primary solution. 6 gm of xylylene diisocyanate and 0.1 gm of dibutylin maleate as a catalyst are added to the solution to give a secondary solution. This procedure is conducted at 20° C.

The secondary solution is added gradually to a solution of 4 gm of gum arabic in 20 gm of water of 15° C. with vigorous stirring, whereby an oil in water emulsion containing drops of 1 μm to 2 μm average diameter are obtained. During the emulsification procedure, the vessel is cooled such that the temperature of the system does not exceed 20° C.

Thereafter, 70 gm of water is poured in the emulsion with stirring and the temperature of the system is gradually increased to 90° C. over a period of 30 minutes. The system is maintained at the same temperature for 60 minutes. Microcapsules with encapsulated antioxidant are obtained.

EXAMPLE 10

Blue Light Formulation

The following composition is prepared at room temperature in an area having ambient light filtered of blue light and UV light.

TABLE 4

| Component | Weight Percent |
|---|---|
| Acrylic Polymer | 25 |
| Calcium Carbonate | 20 |
| Leuco Crystal Viole | 1 |
| Coumarin 314 | 0.5 |
| 0-chloro-hexaarylbiimidazole | 6.5 |
| Polyalkyl betaine polysiloxane copolymer | 2 |
| Propylene glycol monomethyl ether acetate | 10 |
| Water | 35 |

The components are mixed to form an oil in water emulsion as described in Examples 3 and 4. The formulation is stable under the ambient light conditions.

The formulation is used to form a logo on an automobile chassis as described in Example 4 except the laser is a 473 nm Nd:YAG laser. The composition is peelable.

EXAMPLE 11

Blue Light Formulation

A formulation similar to that as disclosed in Example 10 is prepared under the same conditions and components except the color former is leuco malachite green, the amphoteric surfactant is cocamidopropyl betaine, the oxidizing agent is tribromomethyl phenyl sulfone and the organic solvent is TEXANOL™.

The formulation is stable under ambient light conditions filtered of blue and UV wavelenghts. It is used to form a logo on a motor boat using 473 nm Nd:YAG laser. The composition is peelable.

EXAMPLE 12

Green Laser Formulation

The following composition was prepared at room temperature in an area having ambient light filtered of green light.

TABLE 5

| Component | Weight Percent |
|---|---|
| Polyvinyl Acetate | 86 |
| Amphoteric Surfactant | 4 |
| Glycol Ethers | 5 |
| Polyurethane Rheology Modifier | 3 |
| Ethoxylated bisphenyl A dimethyacrylate | 1 |
| Tribromo methyl sulfone | 0.5 |
| n-Phenyl glycine | 0.2 |
| Eosin B | 0.2 |
| Tris(2-methyl-4-diethylaminophenyl)methane | 0.1 |

An emulsion was formed from the components of Table 5 which produced a phototropic response upon application of a laser at a wavelength of 532 nm. The image was stable under ambient light for more than 8 hours.

What is claimed is:

1. An imaging composition comprising one or more xanthene compounds and one or more cyclopentanone based conjugated compounds in sufficient amounts to affect a color or shade change in the imaging composition upon application of energy at powers of 5 mW or less, one or more oxidizing agents, one or more polymers having a $T_g$ from —60° C. to 80° C., and one or more amphoteric surfactants having an isoelectric point of pH 3 to pH 8, the xanthene compounds have the following formula:

(I)

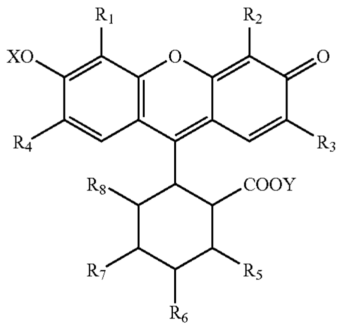

where X is hydrogen, sodium ion, or potassium ion; Y is hydrogen, sodium ion, potassium ion or —$C_2H_5$; $R_1$ is hydrogen, $Cl^-$, $Br^-$; or $I^-$; $R_2$ is hydrogen, $Cl^-$, $Br^-$, or $I^-$; $R_3$ is hydrogen, $Cl^-$, $Br^-$, $I^-$, or —$NO_2$; $R_4$ is hydrogen, —$NO_2$, $Cl^-$, $Br^-$, or $I^-$; $R_5$, is hydrogen, $Cl^-$ or $Br^-$; $R_6$ is hydrogen, $Cl^-$, or $Br^-$; $R_6$ is hydrogen, $Cl^-$, or $Br^-$; $R_7$ is hydrogen, $Cl^-$, or $Br^-$; and $R_8$ is hydrogen, $Cl^-$, or $Br^-$.

2. The imaging composition of claim 1, wherein the one or more amphoteric surfactants are chosen from aminocarboxylic acids, amphoteric imidazoline derivatives, betaines, flurorcarbons, siloxanes, and macromolecular amphoteric surfactants.

3. The imaging composition of claim 1, further comprising one or more reducing agents, color formers, antioxidants, oxidizing agents, film forming polymers, accelerators, rheology modifiers or diluents.

4. The imaging composition of claim 3, wherein the one or more color formers are leuco-type dyes.

5. The imaging composition of claim 3, wherein the one or more reducing agents are chosen from quinone compounds and acyl esters of triethanolamines.

6. The imaging composition of claim 3, wherein the one or more oxidizing agents are chosen from sulfonyl halides and sulfenyl halides.

7. The imaging composition of claim 3, wherein the one or more antioxidants are micro-encapsulated.

8. A method comprising:

a) providing an imaging composition comprising one or more xanthene compounds and one or more cyclopentanone based conjugated compounds in sufficient amounts to affect a color or shade change in the imaging composition upon exposure to energy at powers of 5 mW or less;

b) applying the imaging composition to a work piece;

c) applying the energy at the powers of 5 mW or less to the imaging composition to affect a color or shade change;

d) executing a task on the work piece as directed by the color or shade change of the imaging composition to modify the work piece; and e) peeling the imaging composition from the work piece.

9. The method of claim 8, wherein the work piece is an aeronautical ship, marine vessel, terrestrial vehicle or a textile.

* * * * *